US012621946B2

(12) United States Patent
Robinson et al.

(10) Patent No.: US 12,621,946 B2
(45) Date of Patent: May 5, 2026

(54) HIGH VOLTAGE FEEDTHROUGH APPARATUS

(71) Applicant: Varex Imaging Corporation, Salt Lake City, UT (US)

(72) Inventors: Vance Scott Robinson, South Jordan, UT (US); Jake Riggle, Bountiful, UT (US); Dave Kirkham, South Jordan, UT (US); Travis Harding, West Point, UT (US)

(73) Assignee: VAREX IMAGING CORPORATION, Salt Lake City, UT (US)

( * ) Notice: Subject to any disclaimer, the term of this patent is extended or adjusted under 35 U.S.C. 154(b) by 374 days.

(21) Appl. No.: 18/149,107

(22) Filed: Dec. 31, 2022

(65) Prior Publication Data

US 2024/0224455 A1    Jul. 4, 2024

(51) Int. Cl.
| | |
|---|---|
| *H05K 5/06* | (2006.01) |
| *H05G 1/04* | (2006.01) |
| *H05G 1/10* | (2006.01) |

(52) U.S. Cl.
CPC .............. *H05K 5/069* (2013.01); *H05G 1/04* (2013.01); *H05G 1/10* (2013.01)

(58) Field of Classification Search
CPC .. H05K 5/069; H05G 1/04; H05G 1/10; H01J 35/165; H01J 5/52; H02G 3/083; H02G 3/088
See application file for complete search history.

(56) References Cited

U.S. PATENT DOCUMENTS

| | | | | |
|---|---|---|---|---|
| 3,361,490 A | * | 1/1968 | Bassan | F16J 15/54 |
| | | | | 118/733 |
| 5,119,395 A | * | 6/1992 | Hemsath | F27B 17/0016 |
| | | | | 432/5 |
| 2002/0105784 A1 | * | 8/2002 | Gummin | H05K 7/20336 |
| | | | | 165/104.33 |
| 2003/0201112 A1 | | 10/2003 | Sridhar et al. | |
| 2013/0184797 A1 | * | 7/2013 | Tang | H02G 3/22 |
| | | | | 607/116 |
| 2013/0188328 A1 | * | 7/2013 | Hashemi-Yeganeh | |
| | | | | H01P 11/002 |
| | | | | 361/818 |

(Continued)

FOREIGN PATENT DOCUMENTS

DE          19516831          11/1996

OTHER PUBLICATIONS

Int'l Appl. No. PCT/US2024/017769, International Search Report dated Nov. 11, 2024.

(Continued)

*Primary Examiner* — Timothy J Thompson
*Assistant Examiner* — Aditya Sharma
(74) *Attorney, Agent, or Firm* — Dorsey & Whitney LLP

(57) ABSTRACT

Some embodiments include an apparatus, comprising: a partition; a feedthrough penetrating the partition and hermetically sealed to the partition, the feedthrough having a major axis; a first wall extending from the partition in a first direction along the major axis; and a second wall extending from the partition in a second direction opposite to the first direction along the major axis, the second wall forming a connector interface with the feedthrough; wherein a ratio of a length of the first wall to a thickness of the first wall is greater than or equal to 3:1.

20 Claims, 5 Drawing Sheets

(56) References Cited

U.S. PATENT DOCUMENTS

2014/0098472 A1 *   4/2014  Zhang ................... C03C 21/002
                                                  361/679.01
2018/0331464 A1 *  11/2018  Xia ...................... H02G 15/013
2020/0081483 A1 *   3/2020  Laurent ................... G06F 1/166
2021/0280934 A1 *   9/2021  Hartl .................... H01M 50/15

OTHER PUBLICATIONS

Int'l Appl. No. PCT/US2024/017769, Written Opinion dated Nov. 11, 2024.

* cited by examiner

HIGH VOLTAGE FEEDTHROUGH APPARATUS

X-ray sources include vacuum enclosures. Electrical connections to components within the vacuum enclosure may include feedthroughs that penetrate the vacuum enclosure. To maintain the vacuum within the vacuum enclosure, the feedthrough must maintain a vacuum seal.

DETAILED DESCRIPTION

Embodiments include feedthroughs and, in particular, high voltage feedthroughs for vacuum enclosures. Multi-beam x-ray sources include multiple emitters. The multiple emitters use multiple electrical connections that are electrically isolated from each other and from the vacuum enclosure. Each electrical connection penetrates the vacuum enclosure through a feedthrough. Multiple feedthroughs may be aggregated in a single structure that may be welded to the vacuum enclosure. However, welding may involve temperatures and/or the transfers of heat that may affect the integrity of a vacuum seal formed with the feedthroughs, leading to failures and decreasing a lifetime of the apparatus. As will be described in further detail below, structures may reduce the impact of welding, reducing failures, and increasing the lifetime of the apparatus.

Figure 1:
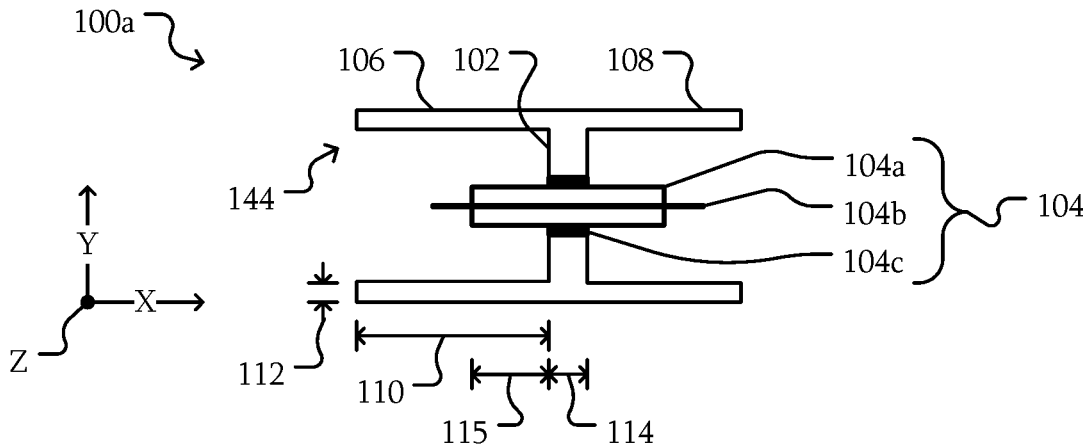
FIG. 1 is a block diagram of a high voltage feedthrough apparatus according to some embodiments.

FIG. 1 is a block diagram of a high voltage feedthrough apparatus according to some embodiments. In some embodiments, an apparatus 100a includes a membrane or partition 102, a feedthrough 104, a first wall 106, and a second wall 108.

The partition 102 is a structure configured to receive the feedthrough 104. The partition 102 may include a vacuum compatible material such as stainless steel, nickel (Ni), copper (Cu), nickel-iron (Ni—Fe) alloys, nickel-cobalt-iron (Ni—Co—Fe) alloys, molybdenum (Mo), aluminum (Al), or the like. The partition 102 may include an opening in which the feedthrough 104 is disposed. The feedthrough 104 penetrates the partition 102, extending through the partition 102. The feedthrough 104 is hermetically sealed to the partition 102.

The feedthrough 104 includes an insulator 104a, a conductor 104b, and a braze ring 104c. The insulator 104a may include a vacuum compatible electrically insulating material such as ceramic, including machinable ceramic, alumina or aluminum oxide ($Al_2O_3$), steatite (including talc, or talcum, composed of hydrated magnesium silicate $Mg_3Si_4O_{10}$ $(OH)_2$), aluminum nitride (AlN), or the like. The conductor 104b includes an electrically conductive material such as copper, steel, including stainless steel, aluminum, iron-nickel-cobalt alloy (e.g., KOVAR), nickel-iron alloy, or the like. The braze ring 104c is hermetically attached to the insulator 104a. The braze ring 104c may include any braze alloy suitable for joining the partition to the insulator, such as silver-copper (Ag—Cu) alloy (e.g., CuSil), copper, silver-copper-indium (Ag—Cu—In) alloy (e.g., InCuSil), or the like. The braze ring 104c is hermetically sealed to the partition 102 and the insulator 104a. For example, the braze ring 104c may be brazed to the partition 102. The feedthrough 104 has a major axis parallel to the conductor 104b. In this example, the major axis is parallel to the X axis. The conductor 104b may be hermetically sealed to the insulator 104a.

The first wall 106 extends from the partition 102 in a first direction along the major axis or X axis. In this example, the first wall 106 extends from the partition 102 in the negative X direction.

The second wall 108 extends from the partition 102 in a second direction opposite to the first direction along the major axis. In this example, the second wall 108 extends from the partition 102 in the positive X direction.

The first wall 106 and the second wall 108 may be formed from the same or similar materials as the partition 102. The partition 102, the first wall 106, and the second wall 108 may be integrated as a single unit.

In some embodiments, the second wall 108 and the feedthrough 104 form a connector interface. For example, the conductor 104b and the insulator 104a may extend from the partition 102 in the positive X direction. The conductor 104b may form the pins of a plug. The second wall 108 may form a housing for the plug. The opening between the feedthrough 104 and the second wall 108 may be configured to receive a receptacle. While a plug has been used as an example of a connector interface formed by the second wall 108 and the feedthrough 104, in other embodiments the connector interface may take different forms. For example, the connector interface may form a receptacle. The conductor 104b may include a female contact configured to connect to a male contact of plug.

In some embodiments, a ratio of a length 110 of the first wall 106 to a thickness 112 of the first wall 106 is greater than or equal to 3:1 or 5:1. In some embodiments, the thickness 112 is about 1 millimeter (mm) to about 3 mm. The length 110 may be greater than about 5 mm to about 10 mm, respectively. In some embodiments, the length 110 is the distance from the partition 102 to the end of the first wall 106. However, as will be descried in further detail below in other embodiments, other structures may be disposed between the first wall 106 and the partition 102. The length 110 may be the distance from that structure to the end of the first wall 106. In some embodiments, the thickness 112 of the first wall 106 may be greater than the thickness 114 of the partition 102. In some embodiments, the partition 102 has a thickness 114 of about 1 millimeter (mm) to about 3 mm. With such as thickness 114, the partition 102 may be thin enough to be easily brazed to the feedthroughs 104 and also thick enough to both withstand a vacuum and prevent leakage through the partition 102. A partition 102 that is too thick may generate some coefficient of thermal expansion (CTE) mismatches on the interface between the insulator 104a and the partition 102 via the braze ring 104c causing the braze to become unreliable as a vacuum seal. A partition 102 that is thinner than the first wall 106 or the second wall 108 may be subject to warping the partition 102 during welding or result of pressure difference between the interior vacuum and exterior pressure.

The structure of the first wall 106 may protect the connection between the partition 102 and the feedthrough 104. For example, the feedthrough 104 may be brazed to the partition 102. As will be described in further detail below, the first wall 106 may be welded to a housing, such as the vacuum enclosure 140 (FIGS. 6-8 and 12), at temperatures at or greater than about 1500 degrees Celsius (° C.) (for typical vacuum enclosure and wall materials). When the weld is formed, heat may be conducted from the weld to the braze between the partition 102 and the feedthrough 104. That braze may have been formed at a temperature between about 600° C. and about 900° C. The heat from the weld may weaken the braze and/or cause deformation on the partition 102. Such stress may cause the hermetic seal at the interface between the feedthrough 104 and the partition 102 to fail.

In a particular example, when heat is transferred to the partition 102, the heat may cause the partition 102 to expand. The expansion of the partition 102 may cause the interface with the feedthrough 104 to fail. The additional heat may also cause a braze between the partition 102 and the feedthrough 104 to weaken or fail. In another example, when heat is applied to the vacuum enclosure 140 during welding, the vacuum enclosure 140 may expand. If that expansion is translated to the partition 102, the interface with the feedthrough 104 may also fail. Modifications to a welding process may not alleviate these stresses. For example, welding in a slower and controlled manner, welding a small portion at a time and allowing that portion to cool, laser welding, dissipating the heat with a heat sink, or the like may not sufficiently prevent the stress. The interface may still fail or the failure rate may be too high, especially when multiple feedthroughs 104 for a partition 102 may be used.

However, a structure of the first wall 106 may reduce the failure rate sufficiently. For example, the aspect ratio of the first wall 106 may increase a thermal resistance between the weld and the partition 102. That is, the relatively thinner first wall 106 may conduct less heat over the welding time that failures due the stress from heat applied to the partition 102 may be reduced.

In addition, the movement of the vacuum enclosure 140 due to expansion during the welding process may be absorbed or accommodated by the first wall 106. Welding to the first wall 106 may be at a location along the first wall 106 offset from the partition 102, such as at a distal end 144 of the first wall 106. A significant portion of that offset is parallel to a plane of the partition 102 and the feedthrough 104. Expansion in the Y-Z plane due to the welding may cause the first wall 106 to deform. The partition 102 will be at least partially isolated from the stress. At least part of the expansion will be absorbed by deformation of the first wall 106 such that less deformations or stress is transferred to the partition 102. These reductions in stress may substantially reduce or eliminate a failure rate of the apparatus 100a after welding.

The relatively thin first wall 106 may also increase the ease of manufacturing. For example, the relatively thin first wall 106 would need less power input in order to weld the first wall 106 to a vacuum enclosure 140. The reduced power would result in less heat and less corresponding stress to the partition 102.

In some embodiments, a minimum thickness 112 of the wall may be large enough so that diffusion through the wall will not affect a vacuum over a lifetime of the apparatus 100a. The thickness of the first wall 106 may be selected based on a range between a minimum thickness that will still prevent sufficient diffusion to maintain a vacuum and a maximum that would still sufficiently limit the transfer of heat to the partition 102 and the feedthrough 104 that may compromise the joint between the partition 102 and the feedthrough 104. The minimum thickness may also depend on a desired structural rigidity, expected impacts, or the like. For example, the apparatus 100a may extend outwards from a vacuum enclosure 140 where the apparatus 100a may suffer impacts during normal usage. The minimum thickness may be a thickness such that a force of an expected impact may not significantly deform the first wall 106 to a point that significantly affects operation. In some embodiments, a minimum thickness may be about 1 millimeter (mm).

Although a braze ring 104c has been used as an example of a structure attaching the insulator 104a to the partition 102, in other embodiments, the insulator 104a may be attached to the partition 102 using techniques other than brazing that are vacuum compatible, such as welding, epoxy, or the like.

In some embodiments, the insulator 104a of the feedthrough may extend a length 115 from the partition 102. This may separate the conductor 104b and the partition 102 by a distance to prevent or reduce a probability of arcing between the conductor 104b and the partition 102. For example, the distance may be sufficient to reduce a probability of arcing with a 1 kilovolt (kV) to 3 kV or more voltage difference between adjacent structures.

In some embodiments, the length of the second wall 108 on the exterior 140b (air side or non-vacuum side) exceeds the length of the feedthroughs 104, specifically the conductor 104b, on the exterior 140b to protect the feedthroughs 104 from incidental contact, impacts, or the like which can bend the conductor 104b or break the insulator 104a.

Figure 2:
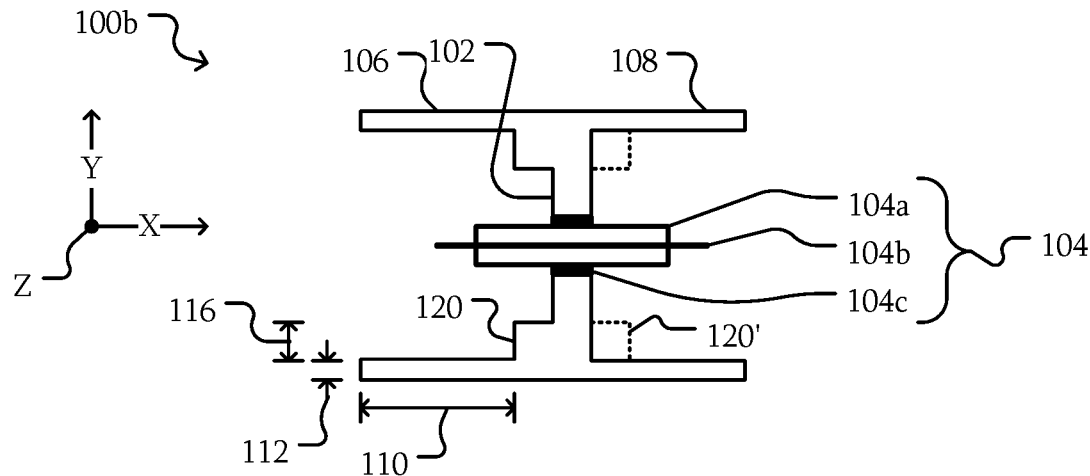
FIG. 2 is a block diagram of a high voltage feedthrough apparatus with a protrusion according to some embodiments.

FIG. 2 is a block diagram of a high voltage feedthrough apparatus with a protrusion according to some embodiments. In some embodiments, the apparatus 100b may be similar to the apparatus 100a or the like. However, the apparatus 100b includes a protrusion 120. The protrusion 120 is disposed within the first wall 106 and coupled to the first wall 106 and the partition 102. The protrusion may have a thickness 116 that is at least twice the thickness 112 of the first wall 106.

Figure 5:
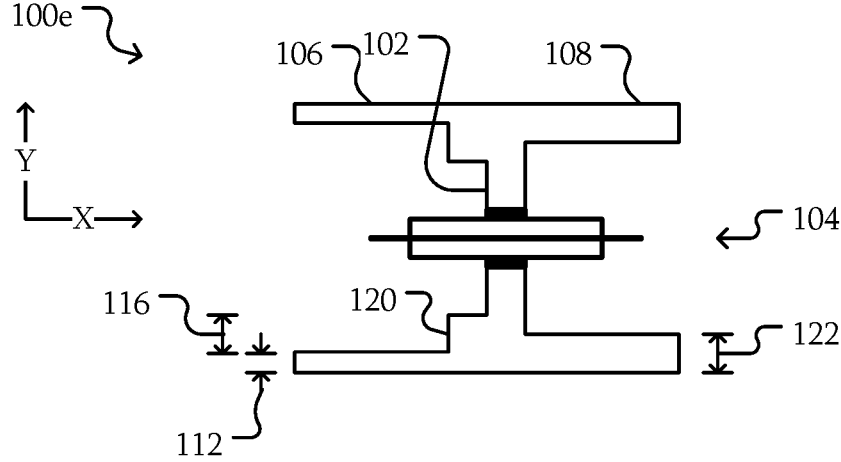
FIG. 5 is a block diagram of a high voltage feedthrough apparatus with walls having different thicknesses and a protrusion according to some embodiments.

The protrusion 120 may add structural stability to the partition 102. The protrusion 120 may add stiffness to the partition 102. The protrusion 120 may be continuous along the first wall 106. However, in other embodiments, the protrusion 120 may include discontinuous structures such as ribs along the first wall 106. As shown in FIG. 5, the protrusion 120 is rectangular. In other embodiments, the protrusion may have a chamfer, bevel, fillet (concave function), round (convex function), or the like.

In some embodiments, the structural stability provided by the protrusion 120 may be opposite to flexibility provided by the first wall 106. While the first wall 106 may be sufficiently thin to allow for flexing in the Y-Z plane, that flexing may be significantly reduced or eliminated at the protrusion 120. Thus, the flexing of the first wall 106 may not be translated to the partition 102 and the joint between the partition 102 and the feedthrough 104.

In some embodiments, the protrusion 120 may be disposed on an opposite side of the partition 102 from the first wall 106 as illustrated by protrusion 120'. In other embodiments, both protrusions 120 and 120' may be coupled to the partition 102.

In some embodiments, the length 110 of the first wall 106 may extend from a protrusion 120. The aspect ratio of the length 110 from the protrusion 120 to the thickness 112 of the first wall 106 may be greater than 3:1 or 5:1.

Figure 3:
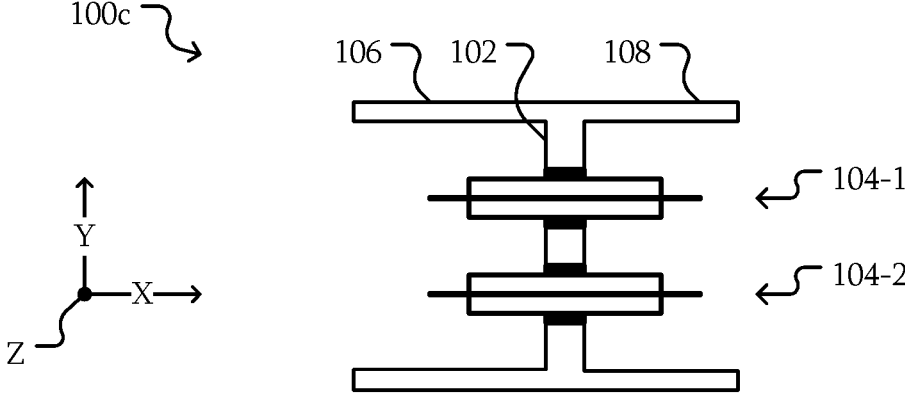
FIG. 3 is a block diagram of a high voltage feedthrough apparatus with multiple feedthroughs according to some embodiments.

FIG. 3 is a block diagram of a high voltage feedthrough apparatus with multiple feedthroughs according to some embodiments. In some embodiments, the apparatus 100c may be similar to the apparatuses 100a-b or the like. However, the apparatus 100c includes multiple feedthroughs 104. Here, two feedthroughs 104-1 and 104-2 are illustrated; however, any number of feedthroughs 104 greater than one may be present. Each of the feedthroughs 104 may be similar to the feedthroughs 104 described above and attached to the partition 102 in similar ways. In some embodiments, the number of feedthroughs 104 may be greater than 5, 10, 15, 20, 50, 100, or more.

The addition of more feedthroughs 104 may make the partition 102 relatively less structurally sound. With more feedthroughs 104, the partition 102 will necessarily have more penetrations, the size may be larger including multiple rows and/or columns of feedthroughs 104. The feedthroughs 104 may be separated by a distance to prevent or reduce a probability of arcing between the feedthroughs 104 and the first wall 106 and/or the second wall 108. For example, the distance may be sufficient to reduce a probability of arcing with a 1 kV to 3 kV or more voltage difference between adjacent structures. In addition, the presence of multiple feedthroughs 104 adds more points of failure. Accordingly, an apparatus 100c with multiple feedthroughs 104 may have a greater need for the benefits of the first wall 106, protrusion 120, distances, thickness, ratios, or the like as described herein than an apparatus with only one feedthrough 104.

Figure 4:
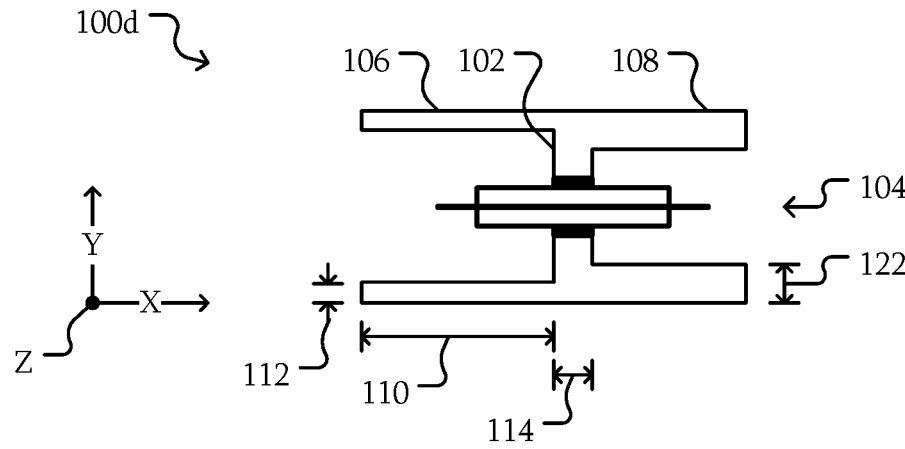
FIG. 4 is a block diagram of a high voltage feedthrough apparatus with walls having different thicknesses according to some embodiments.

FIG. 4 is a block diagram of a high voltage feedthrough apparatus with walls having different thicknesses according to some embodiments. In some embodiments, the apparatus 100d may be similar to the apparatuses 100a-c or the like. However, the apparatus 100d may include both a first wall 106 where a ratio of the length 110 of the first wall 106 to a thickness 112 of the first wall 106 is greater than or equal to 3:1 or 5:1 and a thickness 122 of the second wall 108 is greater than the thickness 112 of the first wall 106. In a particular example, a thickness 112 of the first wall 106 may be about 1 mm and a thickness 122 of the second wall 108 may be about 2 mm or greater.

In some embodiments, as described above, the second wall 108 and the feedthrough 104 may form a connector interface. The thickness, shape, length, or the like of the second wall 108 may be greater in regions to form the connector interface.

FIG. 5 is a block diagram of a high voltage feedthrough apparatus with walls having different thicknesses and a protrusion according to some embodiments. In some embodiments, the apparatus 100e may be similar to the apparatuses 100a-d or the like. However, the apparatus 100e includes a protrusion 120 similar to apparatus 100b. A thickness 116 of the protrusion 120 may be similar to or different from the thickness 122 of the second wall 108. As illustrated, the thickness 122 is less than the thickness 116; however, in other embodiments, the thickness 122 may be greater.

Figure 6:
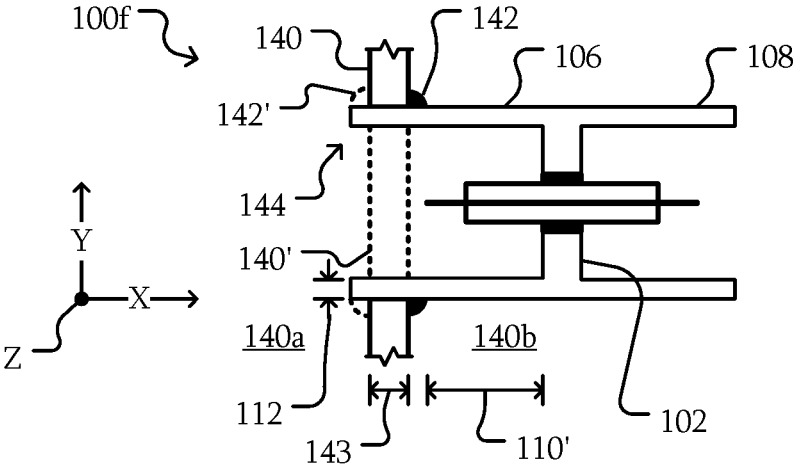
FIG. 6 is a block diagram of a high voltage feedthrough apparatus including a vacuum enclosure according to some embodiments.

FIG. 6 is a block diagram of a high voltage feedthrough apparatus including a vacuum enclosure according to some embodiments. In some embodiments, an apparatus 100f may include structures similar to the apparatuses 100a-e or the like. Structures similar to the apparatus 100a will be used as an example; however, in other embodiments, different structures may be used.

In some embodiments, the apparatus 100f includes a vacuum enclosure 140. Only a portion of the vacuum enclosure 140 is illustrated for clarity. The vacuum enclosure 140 divides an interior 140a having the vacuum and the exterior 140b.

The vacuum enclosure 140 includes an opening 140'. The first wall 106 is disposed in the opening 140'. In some embodiments the first wall 106 is welded to the vacuum enclosure 140 at the opening 140'. The first wall 106 may be welded to the vacuum enclosure 140 substantially at a distal end 144 of the first wall 106. The first wall 106 may extend through the opening 140' a sufficient amount so that the first wall 106 may be welded to the vacuum enclosure 140. As the weld 142 is at the distal end 144 of the first wall 106, the associated welding operation may be offset from the partition 102.

The weld 142 may be disposed on the interior 140a of the vacuum enclosure 140. However, in other embodiments, the weld 142 may be disposed on the exterior 140b of the vacuum enclosure 140. The weld 142' represents the location of this weld on the exterior 140b. The weld 142 or 142' may be disposed at a location along the first wall 106 that is length 110' from the partition 102. The length 110' may long enough such that the aspect ratio of the length 110' to the thickness 112 of the first wall 106 is greater than 3:1 or 5:1. That is, the first wall 106 may be longer than length 110' and thus may have an aspect ratio that is even larger. However, the length 110' of the portion of the first wall 106 from the weld 142 or 142' to the partition still satisfies a minimum aspect ratio of 3:1 or 5:1.

In some embodiments, a thermal resistance of the vacuum enclosure 140 at the opening 140' may be less than that of the first wall 106. For example, a thickness 143 of the vacuum enclosure 140 at the opening 140' may be greater than the thickness 112 of the first wall 106. As a result, heat may be conducted away from the weld 142 into the walls of the vacuum enclosure 140 more so than the first wall 106. This difference in thermal resistance may further reduce a likelihood of failure as more heat is conducted away from the weld 142 and away from the partition 102.

While welding has been used as an example of a technique used to attach the first wall 106 to the vacuum enclosure 140, in other embodiments, different techniques may be used. For example, the first wall 106 may be brazed to the vacuum enclosure 140. Conventionally, brazing is used earlier in the fabrication process and heats the entire component assembly and welding is used later in the fabrication process and heat segments of components to join components together.

Figure 7:
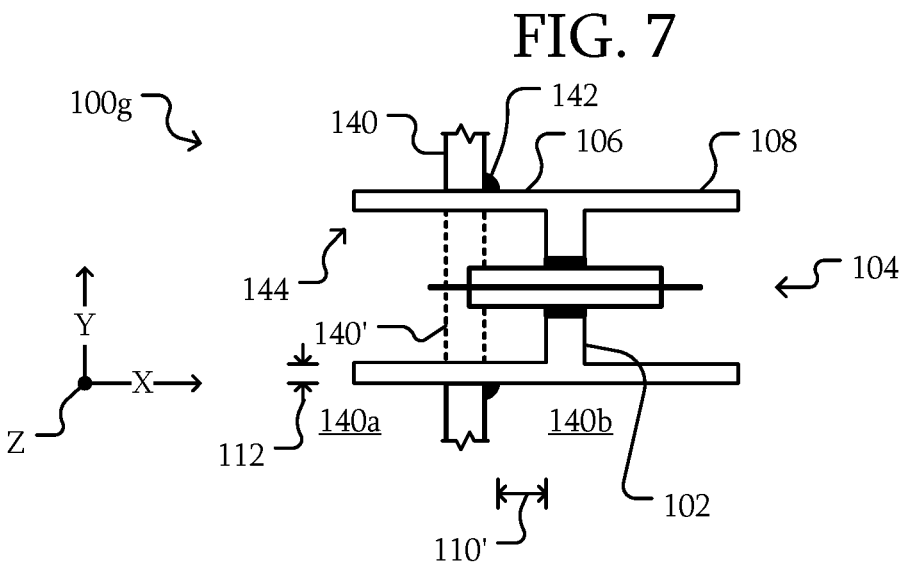
FIGS. 7-8 are block diagrams of a high voltage feedthrough apparatus including a vacuum enclosure and different attachment locations according to some embodiments.
Figure 8:
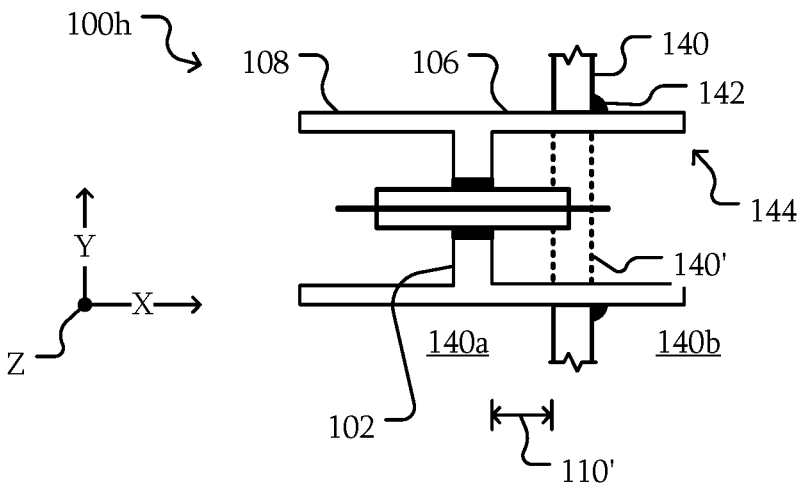

FIGS. 7-8 are block diagrams of a high voltage feedthrough apparatus including a vacuum enclosure and different attachment locations according to some embodiments. Referring to FIG. 7, in some embodiments, the apparatus 100g may be similar to the apparatus 100f or the like and may include structures similar to the apparatuses 100*a-e* or the like where apparatus 100*a* is used as an example. However, the weld 142 at which the vacuum enclosure 140 is welded to the first wall is offset from the distal end 144 of the first wall 106. The length 110' from the near side of the weld 142 to the partition 102 may long enough such that the aspect ratio of the length 110' to the thickness 112 of the first wall 106 is greater than 3:1 or 5:1. Similarly, if the protrusion 120 is present, the length 110' to the protrusion 120 may be long enough to meet or exceed the aspect ratio.

Referring to FIG. 8, in some embodiments, the apparatus 100*h* may be similar to the apparatuses 100*f-g* or the like and may include structures similar to the apparatuses 100*a-e* or the like where apparatus 100*a* is used as an example. However, the second wall 108 is disposed on the inside 140*a* of the vacuum enclosure 140. The first wall 106 may still be attached to vacuum enclosure 140. The length 110' may be from the partition 102 to vacuum enclosure 140 when the weld 142 is on the opposite side of the vacuum enclosure 140. The first wall 106 may have a sufficient length such that the length 110' still satisfies a minimum aspect ratio of 3:1 or 5:1 as described above.

Figure 9:
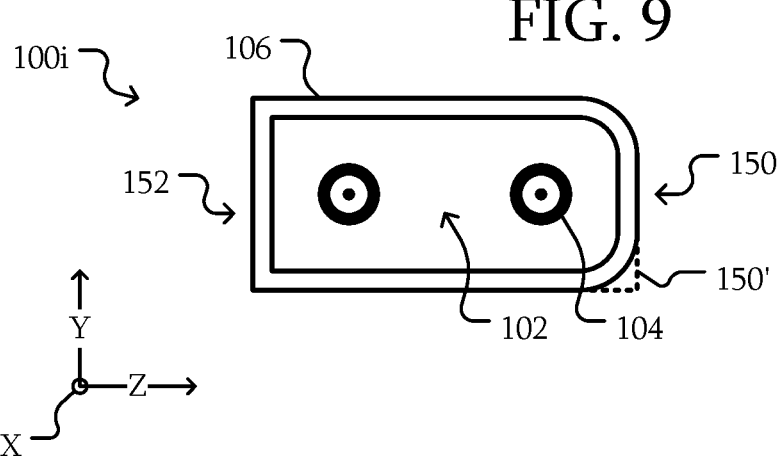
FIGS. 9-10 are block diagrams of a high voltage feedthrough apparatus including a vacuum enclosure and keyed structures according to some embodiments.
Figure 10:
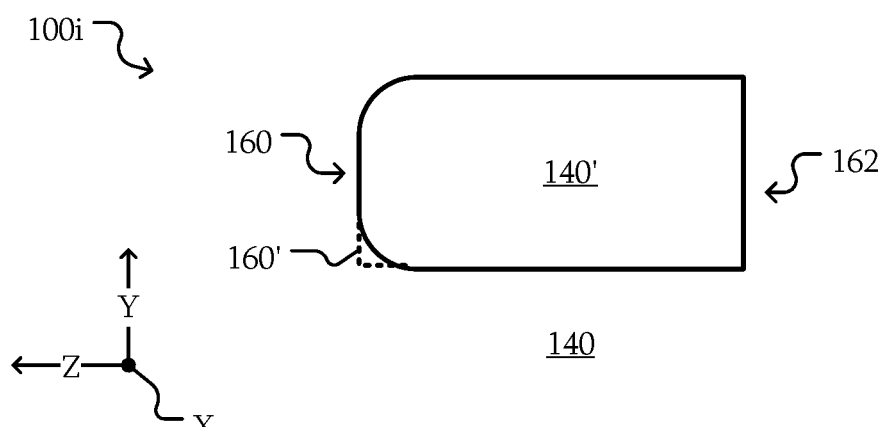

FIGS. 9-10 are block diagrams of a high voltage feed-through apparatus including a vacuum enclosure and keyed structures according to some embodiments. FIG. 9 is a view of the feedthroughs 104 and first wall 106 showing keyed structures. FIG. 10 is a view of the vacuum enclosure 140 and the opening 140' showing the matching keyed structures. Referring to FIGS. 9 and 10, in some embodiments, the apparatus 100*i* may be similar to the apparatuses 100*f-g* or the like. However, the first wall 106 includes a keyed structure. In this example, the first wall 106 has a first end 150 with rounded corners. A second end 152 includes square corners.

The opening 140' of the vacuum enclosure 140 includes matching keyed structures. The first end 160 of the opening 140' includes rounded corners and the second end 162 includes square corners corresponding to the similar features of the first wall 106. The keyed structures of the first wall 106 and the opening 140' are complementary such that the first wall 106 may be inserted into the opening 140' in only one orientation.

In some embodiments, the only one orientation may be associated with the side of the vacuum enclosure 140 from which the first wall 106 is inserted. For example, the first wall 106 may be intended to be inserted from an exterior 140*b* of the vacuum enclosure 140 in only one orientation. While the first wall 106 may be insertable from the interior 140*a*, the first wall 106 is insertable from the exterior 104*b* side of the vacuum enclosure 140 in only one orientation.

In other embodiments, the keyed structures of the first wall 106 and the opening 140' may prevent insertion except in only one orientation regardless of insertion direction. For example, corners 150' and 160' of the first wall 106 and the opening 140', respectively, may allow the first wall 106 to be inserted in only one orientation regardless of the side of the vacuum enclosure 140 from which an insertion is attempted.

Figure 11:
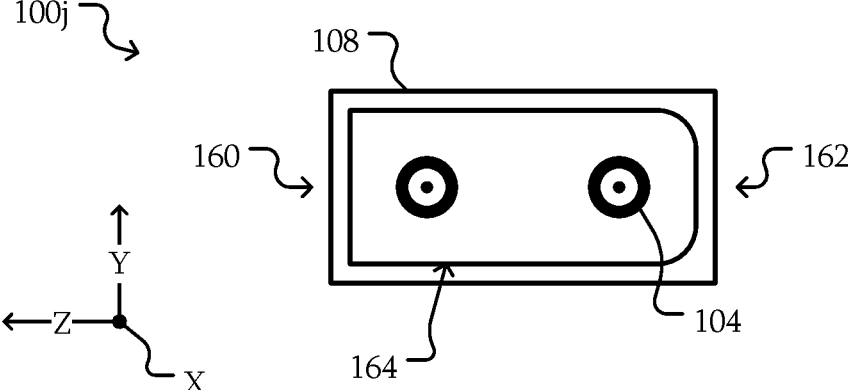
FIG. 11 is a block diagram of a high voltage feedthrough apparatus including another keyed structure according to some embodiments.

FIG. 11 is a block diagram of a high voltage feedthrough apparatus including another keyed structure according to some embodiments. In some embodiments, the apparatus 100*j* may be similar to the apparatuses 100*a-i* or the like. However, the apparatus 100*j* includes a second wall 108 having a keyed structure. The keyed structure permits insertion of a connector in only one orientation.

Figure 12:
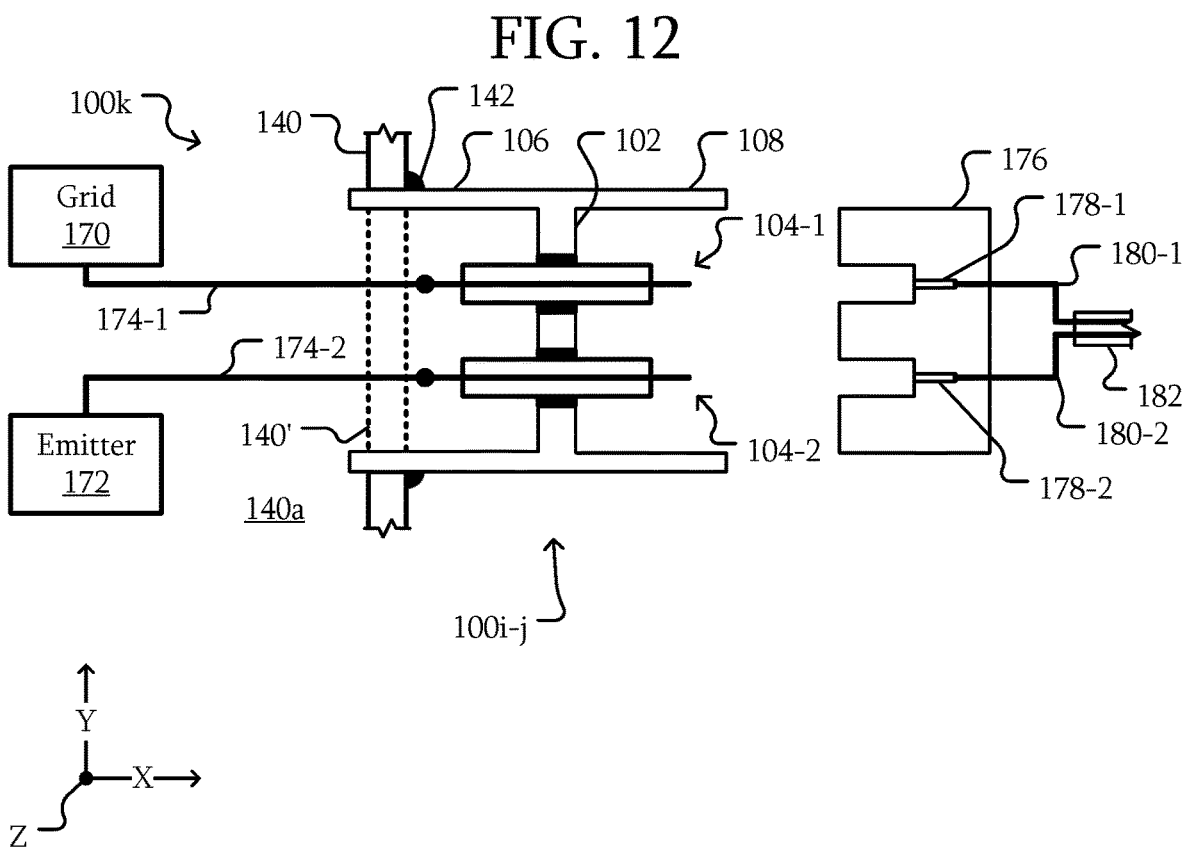
FIG. 12 is a block diagram of a high voltage feedthrough apparatus including multiple keyed structures according to some embodiments.

FIG. 12 is a block diagram of a high voltage feedthrough apparatus including multiple keyed structures according to some embodiments. In some embodiments, the keyed structure of the second wall 108 of apparatus 100*j* may be used with the keyed structures of the first wall 106 and the opening 140' of apparatus 100*i*. The combination of the keyed structures results in a predetermined physical location for the feedthroughs 104. Within 140*a*, internal to the vacuum enclosure 140, electrical connections are formed with various devices. Here, a grid 170 and an emitter 172 are used as examples of such devices. Another such device (not shown) may be a focusing aperture. In another embodiment (not shown), the feedthroughs 104 can provide multiple connections to grids, emitters, and/or focusing apertures.

In some embodiments, the grid 170 and the emitter 172 are disposed within the vacuum enclosure 140 at predetermined locations. Electrical connections 174-1 and 174-2 electrically connect the grid 170 and the emitter 172 to corresponding feedthroughs 104-1 and 104-2. Due to the keyed structures of the first wall 106 and the opening 140', the physical location of the feedthrough 104-1 will correspond to the physical location of the grid 170 and the physical location of the feedthrough 104-2 will correspond to the physical location of the emitter 172.

In other embodiments, the grid 170 and the emitter 172 may not be in predetermined locations. However, the predetermined locations of the feedthroughs 104 will still correspond to the devices. That is, the physical location of the feedthrough 104-1 will correspond to the electrical connection 174-1 that connects to the grid 170 and the physical location of the feedthrough 104-2 will correspond to the electrical connection 174-2 that connects to the emitter 172.

Because of the keyed structure of the second wall 108, a connector 176 may be inserted in only one orientation. The connector 176 includes contacts 178-1 and 178-2. The contacts 178-1 and 178-2 will only contact the feedthroughs 104-1 and 104-2, respectively. The wire 180-1 of the cable 182 will electrically connect to the grid 170 and the wire 180-2 of the cable 182 will electrically connect to the emitter 172 in the only orientation permitted due to the keyed structures of the first wall 106, opening 140', and second wall 108.

Figure 13:
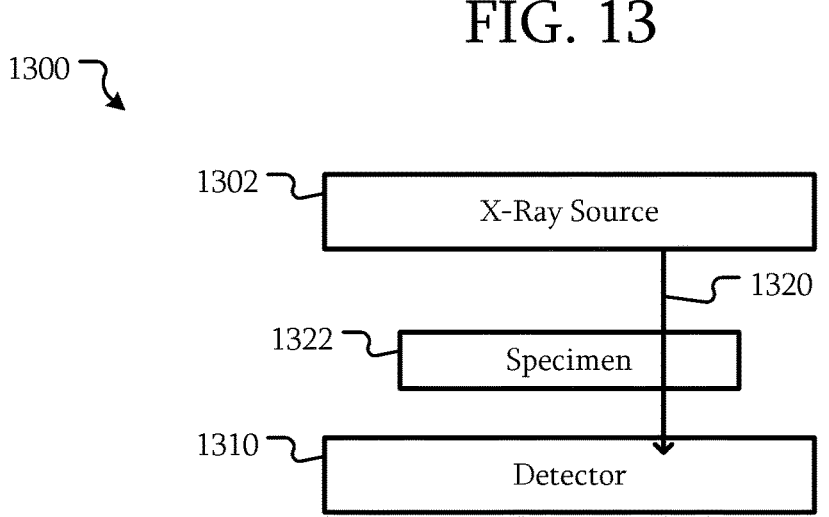
FIG. 13 is a block diagram of an x-ray imaging system according to some embodiments.

FIG. 13 is a block diagram of an x-ray imaging system according to some embodiments. The x-ray imaging system 1300 includes an x-ray source 1302 and detector 1310. The x-ray source 1302 may include an apparatus 100 or the like as described above. The x-ray source 1302 is disposed relative to the detector 1310 such that x-rays 1320 may be generated to pass through a specimen 1322 and detected by the detector 1310. In some embodiments, the detector 1310 is part of a medical imaging system. In other embodiments, the x-ray imaging system 1300 may include a security or industrial scanning system as part of a baggage scanning system or part inspection system, respectively. The system 1300 may be any system that may include an x-ray detector.

Some embodiments include an apparatus 100, 100*a-100k*, comprising: a partition 102; a feedthrough 104 penetrating the partition 102 and hermetically sealed to the partition 102, the feedthrough 104 having a major axis; a first wall 106 extending from the partition 102 in a first direction along the major axis; and a second wall 108 extending from the partition 102 in a second direction opposite to the first direction along the major axis, the second wall 108 forming a connector interface with the feedthrough 104; wherein a ratio of a length of the first wall 106 to a thickness of the first wall 106 is greater than or equal to 3:1.

In some embodiments, a thickness of the second wall 108 is greater than the thickness of the first wall 106.

In some embodiments, the apparatus 100, 100a-100k further comprises a protrusion 120 disposed within the first wall 106 and coupled to the first wall 106 and the partition 102.

In some embodiments, a thickness of the protrusion 120 is at least twice a thickness of the first wall 106.

In some embodiments, the apparatus 100, 100a-100k further comprises a vacuum enclosure 140 having an opening 140'; wherein the first wall 106 is disposed in the opening 140'.

In some embodiments, the first wall 106 is welded to the vacuum enclosure 140 at a distal end of the first wall 106.

In some embodiments, the first wall 106 includes a first keyed structure; the opening 140' includes a second keyed structure; and the first keyed structure and the second keyed structure are complementary such that the first wall 106 may be inserted into the opening 140' in only one orientation.

In some embodiments, the second wall 108 includes a third keyed structure.

In some embodiments, a thickness of the first wall 106 is about 1 millimeter (mm) to about 3 mm.

In some embodiments, the feedthrough 104 is one of a plurality of feedthrough 104s penetrating the partition 102 and hermetically sealed to the partition 102.

Some embodiments include an apparatus 100, 100a-100k, comprising: a partition 102; a feedthrough 104 penetrating the partition 102 and hermetically sealed to the partition 102, the feedthrough 104 having a major axis; a first wall 106 extending from the partition 102 in a first direction along the major axis; and a second wall 108 extending from the partition 102 in a second direction opposite to the first direction along the major axis; wherein: a ratio of a length of the first wall 106 to a thickness of the first wall 106 is greater than or equal to 3:1; and the first wall 106 includes a first keyed structure.

In some embodiments, the second wall 108 forms a connector interface with the feedthrough 104.

In some embodiments, the apparatus 100, 100a-100k further comprises a protrusion 120 disposed within the first wall 106 and coupled to the first wall 106 and the partition 102.

In some embodiments, a thickness of the second wall 108 is at least two times the thickness of the first wall 106.

In some embodiments, the apparatus 100, 100a-100k further comprises a vacuum enclosure 140 having an opening 140'; wherein the first wall 106 is welded to the vacuum enclosure 140 at the opening 140'.

In some embodiments, the opening 140' includes a second keyed structure; and the first keyed structure and the second keyed structure are complementary such that the first wall 106 may be inserted into the opening 140' in only one orientation.

In some embodiments, the second wall 108 includes a third keyed structure.

In some embodiments, the thickness of the first wall 106 is about 1 millimeter (mm) to about 3 mm.

Some embodiments include an apparatus, comprising: means for supporting an electrical connection; means for hermetically passing the electrical connection through the means for supporting the electrical connection; means for maintaining a vacuum; and means for hermetically connecting the means for supporting the electrical connection to the means for maintaining the vacuum, including means for limiting a transfer of thermal and mechanical stress from the means for maintaining the vacuum to the means for supporting the electrical connection.

Examples of the means for supporting an electrical connection include the partition 102 or the like.

Examples of the means for hermetically passing the electrical connection through the means for supporting the electrical connection include the feedthrough 104 or the like.

Examples of the means for maintaining a vacuum include the vacuum enclosure 140 or the like.

Examples of the means for hermetically connecting the means for supporting the electrical connection to the means for maintaining the vacuum include the first wall 106, a weld 142, or the like.

Examples of the means for limiting a transfer of thermal and mechanical stress from the means for maintaining the vacuum to the means for supporting the electrical connection include the first wall 106 or the like having an aspect ratio greater than 3:1 as described above. Below this aspect ratio, the transfer of thermal or mechanical stress may not be sufficient to maintain the vacuum.

In some embodiments, the apparatus further comprises means for reinforcing a connection between the means for supporting the electrical connection and the means for hermetically connecting the means for supporting the electrical connection to the means for maintaining the vacuum.

Examples of the means for reinforcing a connection between the means for supporting the electrical connection and the means for hermetically connecting the means for supporting the electrical connection to the means for maintaining the vacuum include the protrusion 120.

Although the structures, devices, methods, and systems have been described in accordance with particular embodiments, one of ordinary skill in the art will readily recognize that many variations to the particular embodiments are possible, and any variations should therefore be considered to be within the spirit and scope disclosed herein. Accordingly, many modifications may be made by one of ordinary skill in the art without departing from the spirit and scope of the appended claims.

The claims following this written disclosure are hereby expressly incorporated into the present written disclosure, with each claim standing on its own as a separate embodiment. This disclosure includes all permutations of the independent claims with their dependent claims. Moreover, additional embodiments capable of derivation from the independent and dependent claims that follow are also expressly incorporated into the present written description. These additional embodiments are determined by replacing the dependency of a given dependent claim with the phrase "any of the claims beginning with claim [x] and ending with the claim that immediately precedes this one," where the bracketed term "[x]" is replaced with the number of the most recently recited independent claim. For example, for the first claim set that begins with independent claim 1, claim 4 can depend from either of claims 1 and 3, with these separate dependencies yielding two distinct embodiments; claim 5 can depend from any one of claim 1, 3, or 4, with these separate dependencies yielding three distinct embodiments; claim 6 can depend from any one of claim 1, 3, 4, or 5, with these separate dependencies yielding four distinct embodiments; and so on.

Recitation in the claims of the term "first" with respect to a feature or element does not necessarily imply the existence of a second or additional such feature or element. Elements specifically recited in means-plus-function format, if any, are intended to be construed to cover the corresponding structure, material, or acts described herein and equivalents thereof in accordance with 35 U.S.C. § 112(f). Embodiments of the invention in which an exclusive property or privilege is claimed are defined as follows.

The invention claimed is:

1. An apparatus, comprising:
a partition;
a feedthrough penetrating the partition and hermetically sealed to the partition, the feedthrough having a first longitudinal axis;
a first wall extending from the partition in a first direction parallel to the first longitudinal axis;
a second wall extending from the partition in a second direction opposite to the first direction and parallel to the first longitudinal axis, the second wall forming a connector interface with the feedthrough; and
a vacuum enclosure;
wherein:
a ratio of a length of the first wall to a thickness of the first wall is greater than or equal to 3:1;
the partition and the first wall are formed from a single, continuous material; and
the first wall is configured to thermally isolate a hermetic seal between the partition and the feedthrough from a weld between the first wall and the vacuum enclosure.

2. The apparatus of claim 1, wherein: a thickness of the second wall is greater than the thickness of the first wall.

3. The apparatus of claim 1, further comprising: a protrusion disposed within the first wall and coupled to the first wall and the partition.

4. The apparatus of claim 3, wherein: a thickness of the protrusion is at least twice a thickness of the first wall.

5. The apparatus of claim 1, wherein:
the vacuum enclosure has an opening; and
the first wall is disposed in the opening.

6. The apparatus of claim 5, wherein: the first wall is welded to the vacuum enclosure at a distal end of the first wall.

7. The apparatus of claim 5, wherein: the first wall includes a first keyed structure; the opening includes a second keyed structure; and the first keyed structure and the second keyed structure are complementary such that the first wall may be inserted into the opening in only one orientation.

8. The apparatus of claim 7, wherein: the second wall includes a third keyed structure.

9. The apparatus of claim 1, wherein: a thickness of the first wall is about 1 millimeter (mm) to about 3 mm.

10. The apparatus of claim 1, wherein: the feedthrough is one of a plurality of feedthroughs penetrating the partition and hermetically sealed to the partition.

11. An apparatus, comprising:
a partition;
a feedthrough penetrating the partition and hermetically sealed to the partition, the feedthrough having a first longitudinal axis;
a first wall extending from the partition in a first direction parallel to the first longitudinal axis; and
a second wall extending from the partition in a second direction opposite to the first direction and parallel to the first longitudinal axis;
wherein:
a ratio of a length of the first wall to a thickness of the first wall is greater than or equal to 3:1; and
a periphery of the first wall defines a first keyed structure.

12. The apparatus of claim 11, wherein: the second wall forms a connector interface with the feedthrough.

13. The apparatus of claim 11, further comprising: a protrusion disposed within the first wall and coupled to the first wall and the partition.

14. The apparatus of claim 11, wherein: a thickness of the second wall is at least two times the thickness of the first wall.

15. The apparatus of claim 11, further comprising: a vacuum enclosure having an opening; wherein the first wall is welded to the vacuum enclosure at the opening.

16. The apparatus of claim 15, wherein: the opening includes a second keyed structure; and the first keyed structure and the second keyed structure are complementary such that the first wall may be inserted into the opening in only one orientation.

17. The apparatus of claim 16, wherein: the second wall includes a third keyed structure.

18. The apparatus of claim 11, wherein: the thickness of the first wall is about 1 millimeter (mm) to about 3 mm.

19. An apparatus, comprising:
a partition for supporting an electrical connection;
a feedthrough for hermetically passing the electrical connection through the partition;
a vacuum enclosure; and
a first wall extending from the partition in a direction perpendicular to a longitudinal axis of the partition and hermetically connecting the partition to the vacuum enclosure at a weld, wherein:
a ratio of a length of the first wall to a thickness of the first wall is greater than or equal to 3:1;
the feedthrough is brazed to the partition;
the first wall is welded to the vacuum enclosure; and
the first wall is configured to thermally isolate the partition from the weld between the first wall and the vacuum enclosure.

20. The apparatus of claim 19, further comprising: a protrusion for reinforcing a connection between the partition and the first wall.

* * * * *